United States Patent
Lee

(10) Patent No.: US 6,648,224 B2
(45) Date of Patent: Nov. 18, 2003

(54) FLASH MEMORY CARD READER WITH LOW THICKNESS

(75) Inventor: Chung-Liang Lee, Taipei (TW)

(73) Assignee: Power Quotient International Co., Ltd., Taipei Hsien (TW)

( * ) Notice: Subject to any disclaimer, the term of this patent is extended or adjusted under 35 U.S.C. 154(b) by 79 days.

(21) Appl. No.: 09/988,531

(22) Filed: Nov. 20, 2001

(65) Prior Publication Data

US 2003/0094490 A1 May 22, 2003

(51) Int. Cl.[7] .............................. G06K 7/08; G06K 7/00
(52) U.S. Cl. ........................................ 235/451; 235/486
(58) Field of Search ................................ 235/451, 486, 235/487

(56) References Cited

U.S. PATENT DOCUMENTS

| | | | | |
|---|---|---|---|---|
| 6,137,710 A | * | 10/2000 | Iwasaki et al. ................ | 365/52 |
| 6,438,638 B1 | * | 8/2002 | Jones et al. ................... | 710/301 |
| 2002/0020745 A1 | * | 2/2002 | Yap et al. ..................... | 235/451 |
| 2002/0166009 A1 | * | 11/2002 | Lin .............................. | 710/74 |
| 2002/0178307 A1 | * | 11/2002 | Pua et al. ..................... | 710/62 |
| 2002/0185533 A1 | * | 12/2002 | Shieh et al. ................. | 235/441 |

* cited by examiner

Primary Examiner—Thien M. Le
Assistant Examiner—April Nowlin
(74) Attorney, Agent, or Firm—Troxell Law Office PLLC

(57) ABSTRACT

A connective device in a partition and screen system comprises at least and upright post, a plurality of retaining pins, a plurality of trunking parts longitudinal, and at least a partition. The upright post is cylindrical with a homogeneous cross section with longitudinal slide grooves circumferentially disposed through the entire length thereof. The retaining pins are selectively inserted into the slide grooves and each of the retaining pins has an arched side with two opposite lateral edges. The trunking parts are connected to the respective coupling pieces so as to be positioned next to the upper end and the lower end of the upright post. The partition fits with two of the trunking parts in a way of being disposed between one next to the upper end of the upright post and the other one next to the lower end of the upright post.

4 Claims, 4 Drawing Sheets

FLASH MEMORY CARD READER WITH LOW THICKNESS

BACKGROUND OF THE INVENTION

1. Field of the Invention

The present invention relates to a flash memory card reader, and, particularly, to a pocket flash memory card reader, which is possible to be inserted with different types flash memory cards conveniently.

2. Description of Related Art

Currently, the flash memory card reader provided in the market usually has an insertion slot for a specific flash memory card only. Due to the conventional card reader being influenced by the configuration thereof and the wire attached, it is hard to be carried about with the user.

SUMMARY OF THE INVENTION

A flash memory card reader with a low thickness according to the present invention comprises a casing, a print circuit board, and a universal series bus terminal. At least three insertion slots are arranged in the casing for a type I/a type II compact flash memory card, a smart media card and a multi media card/a secure digital.

An object of the present invention provides a flash memory card reader with a low thickness, which can be received in a pocket conveniently in addition to being arranged with at least three insertion slots for three different flash memory cards.

BRIEF DESCRIPTION OF THE DRAWINGS

The present invention can be more fully understood by reference to the following description and accompanying drawings, in which.

DETAILED DESCRIPTION OF THE PREFERRED EMBODIMENTS

Figure 1A:
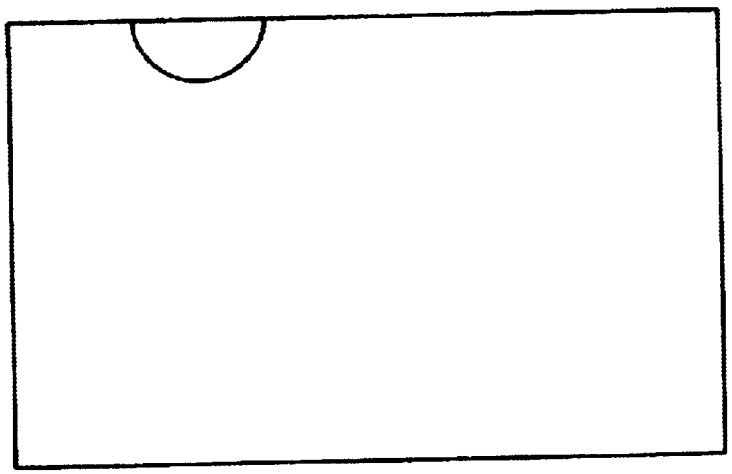
FIG. 1 is a perspective view of a flash memory card reader according to the present invention illustrating the appearance thereof.
Figure 1B:

Referring to FIGS. 1A and 1B, a flash memory card reader of the present invention can be a shape of flat rectangle and it has been made actually with 98.3 mm in length, 62.65 mm in width, and 11.5 mm in height so that it provides a super-think size like a name card available for being received in a clothes-pocket. It is noted that the preceding actual size of the flash memory card reader is one of examples in practice and not for a restriction.

Figure 2A:
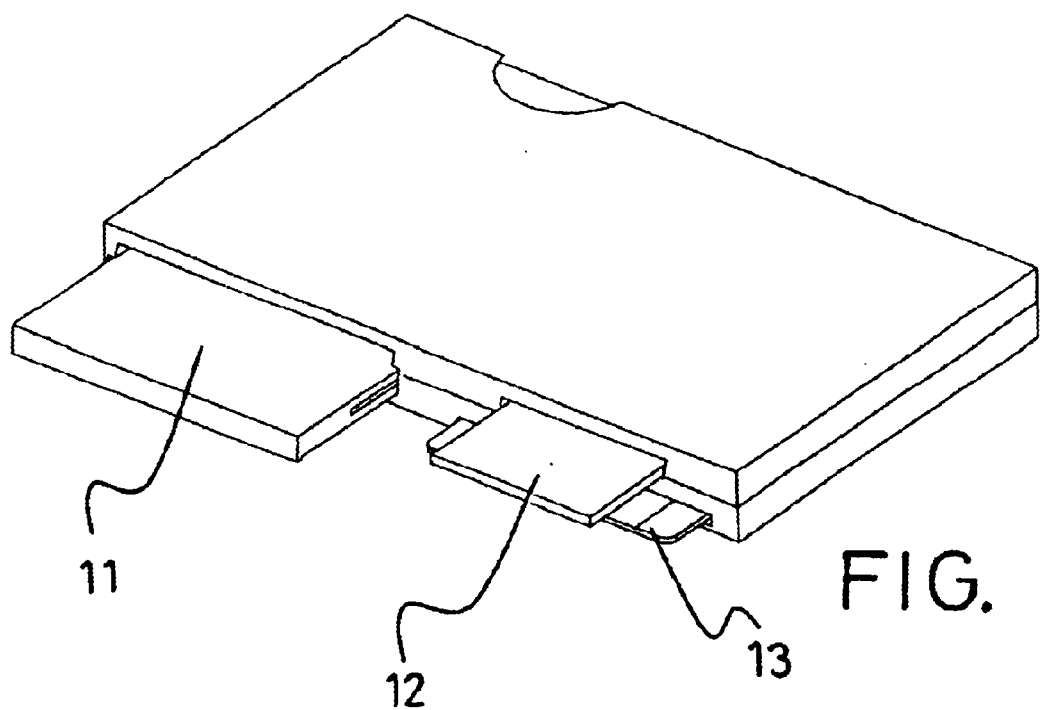
FIG. 2 is a perspective view of a flash memory card reader according to the present invention illustrating an arrangement of card slots thereof.
Figure 2B:
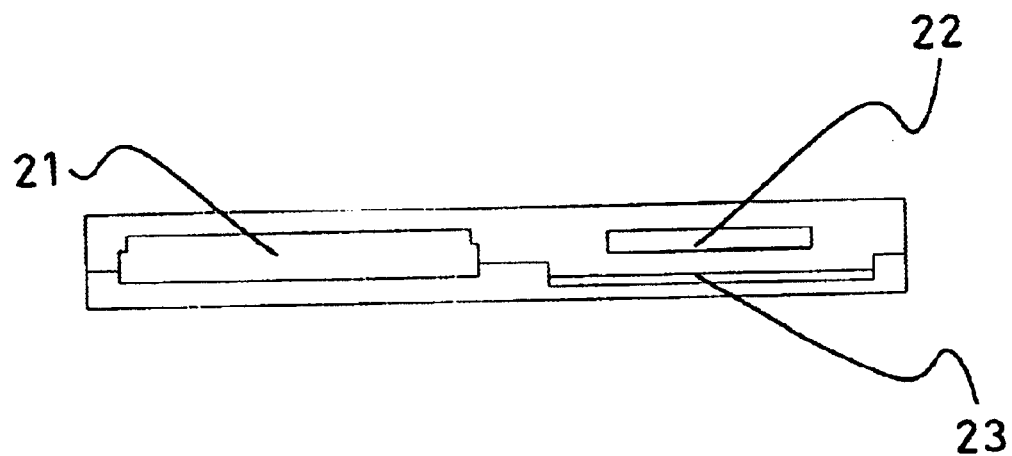

Referring to FIGS. 2A and 2B, the innovation of the present invention resides in that the card reader offers three different types of insertion slots, which include a first slot 21 for a compact flash card 21 (type I and type II), a second slot 22 for a smart media card 12 and a third slot 23 for a multi media card 13. The second slot 22 and the third slot 23 are disposed at a lateral side of the first slot 21 and the third slot 23 further can be compatibly inserted with the secure digital card.

Figure 3:
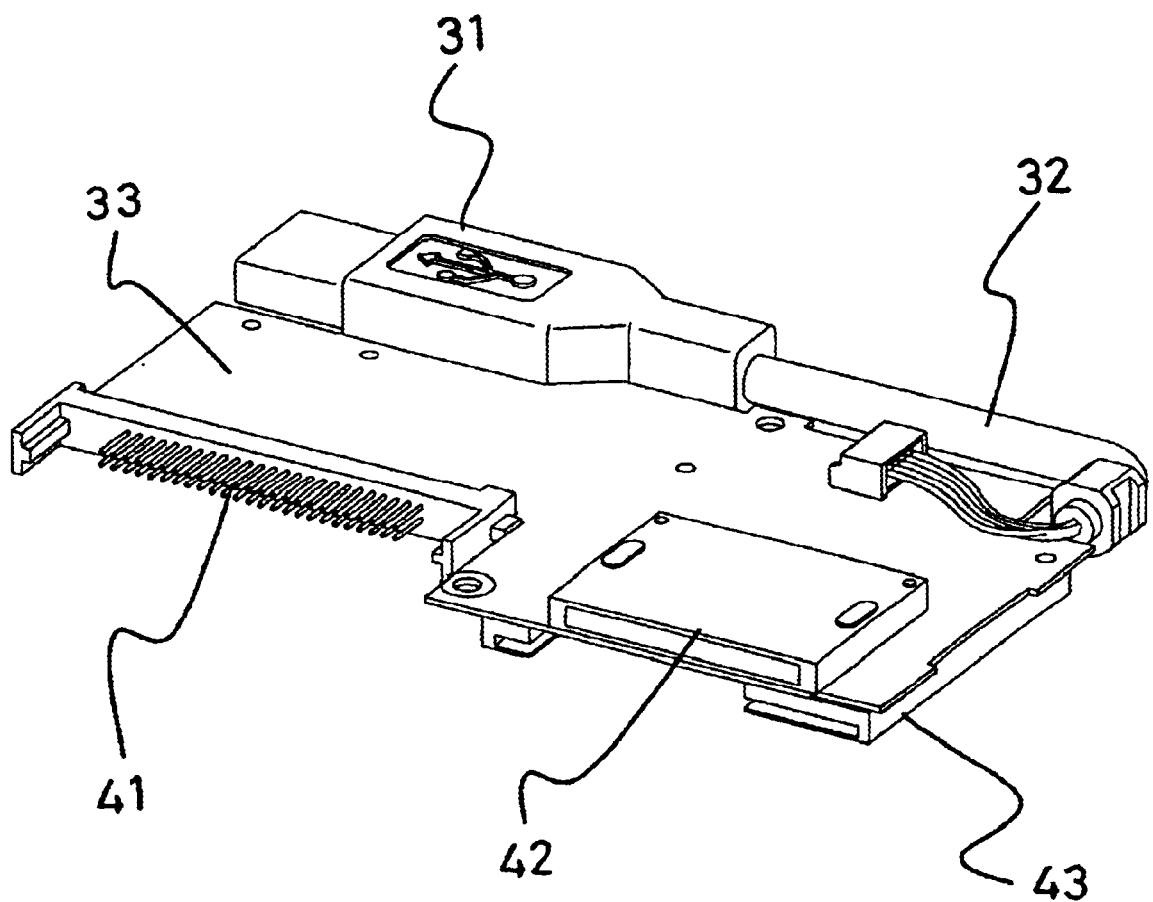
FIG. 3 is a perspective view of a flash memory card reader according to the present invention illustrating an arrangement of the hardware thereof.

Referring to FIG. 3, the hardware corresponding to each insertion slot is illustrated. A first slot base 41 corresponds to the first insertion slot 21 and a second slot base 42 corresponds to the second insertion slot 22. Similarly, a third slot base 43 corresponds to the third insertion slot 23, and the second slot base 42 and the third slot base 43 may be fixed to a circuit board 33. Besides, the circuit board 33 can be connected to a universal series bus terminal 31 via a wire 32 attached to the universal series bus terminal.

Figure 4A:
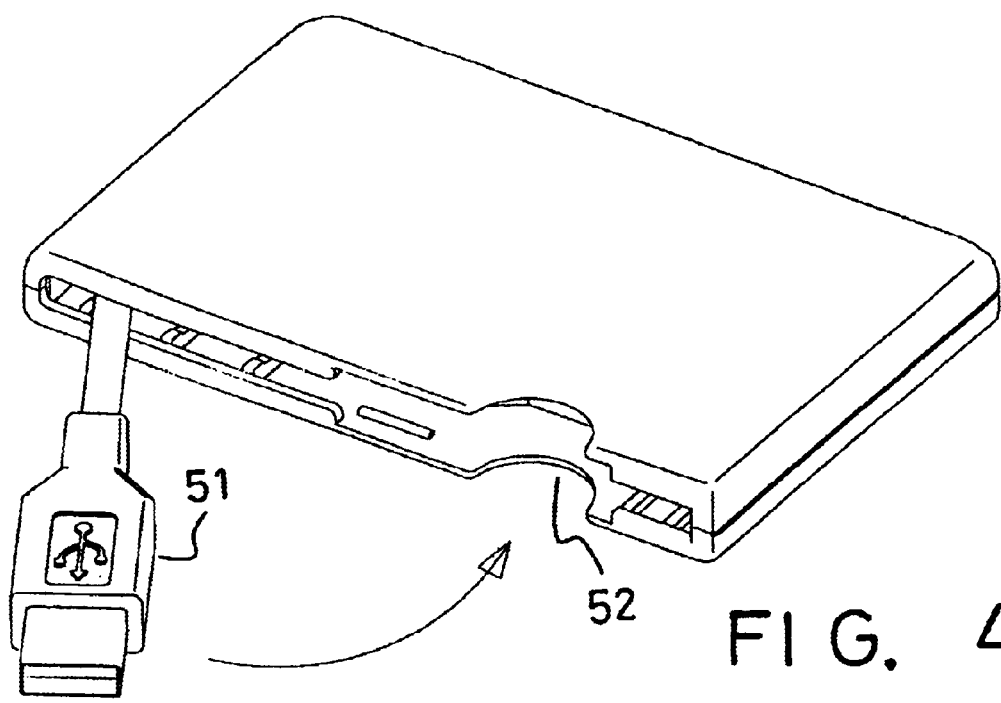
FIG. 4 is a perspective view illustrating the terminal of the universal series bus with the wire in a state of being stored up.
Figure 4B:
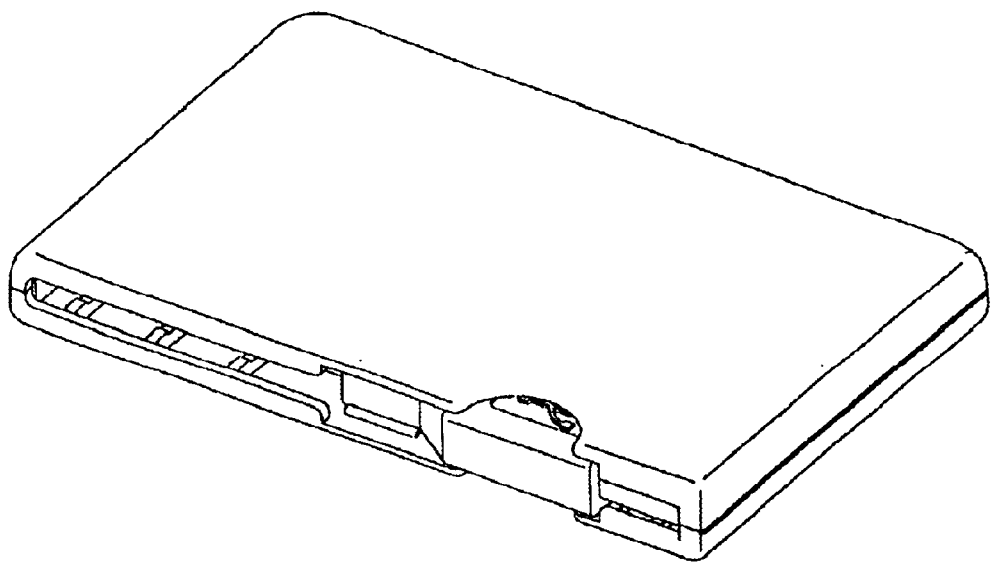

Referring to FIGS. 4A and 4B, a perspective view shown is the card reader of the present invention from another projection angle and it can be seen that a groove is provided to oppositely correspond to the preceding insertion slot 21 with a semicircular recess 52 at an end thereof so that a facial side 51 with a smallest height on the universal series bus terminal 31, i.e., a thinnest part of the universal series bus can be inset into and be received in the groove. In this way, the problem with regard to settling the terminal and the wire can be solved completely.

While the invention has been described with reference to a preferred embodiment thereof, it is to be understood that modifications or variations may be easily made without departing from the spirit of this invention, which is defined in the appended claims.

What is claimed is:

1. A thin flash memory card reader comprising:
   a) a casing having an interior;
   b) a printed circuit board connected within the interior of the casing;
   c) at least three different types of insertion slots for at least three different types of cards, each insertion slot having a slot base connected to the printed circuit board, the types of cards being selected from a group consisting of a flash memory card, a smart media card, a multi media card, and a secure digital card; and
   d) a universal series bus terminal having a cable connected to the circuit board, wherein the universal series bus terminal is movable between a retracted position within the casing for storage and an extended position in which the universal series bus terminal extends out of the casing for use.

2. The thin flash memory card reader according to claim 1, wherein all of the insertion slots are provided in the casing.

3. The thin flash memory card reader according to claim 1, wherein the casing has a semicircular recess adjacent to the universal series bus terminal in the retracted position.

4. The thin flash memory card reader according to claim 1, wherein the casing has a rectangular-parallelepiped shape.

* * * * *